US009728622B1

(12) United States Patent
Bergendahl et al.

(10) Patent No.: US 9,728,622 B1
(45) Date of Patent: Aug. 8, 2017

(54) DUMMY GATE FORMATION USING SPACER PULL DOWN HARDMASK

(71) Applicant: International Business Machines Corporation, Armonk, NY (US)

(72) Inventors: Marc A. Bergendahl, Troy, NY (US); Kangguo Cheng, Schenectady, NY (US); Fee Li Lie, Albany, NY (US); Eric R. Miller, Schenectady, NY (US); John R. Sporre, Albany, NY (US); Sean Teehan, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/149,764

(22) Filed: May 9, 2016

(51) Int. Cl.
*H01L 21/28* (2006.01)
*H01L 21/311* (2006.01)
(Continued)

(52) U.S. Cl.
CPC ...... *H01L 29/6653* (2013.01); *H01L 21/0217* (2013.01); *H01L 21/02164* (2013.01);
(Continued)

(58) Field of Classification Search
CPC ........... H01L 29/6653; H01L 29/66795; H01L 29/66545; H01L 21/28247; H01L 21/31116; H01L 29/0657; H01L 29/4916; H01L 21/0217; H01L 21/02164; H01L 21/31144
(Continued)

(56) References Cited

U.S. PATENT DOCUMENTS 6,987,068 B2  1/2006 Friis et al.
7,638,402 B2  12/2009 Nandakumar et al.
(Continued)

FOREIGN PATENT DOCUMENTS

WO    2013101237 A1    7/2013
WO    2013154842 A1    10/2013

OTHER PUBLICATIONS

Liu, Chi-Chun, et al.; "Towards Electrical Testable SOI Devices Using Directed Self-Assembly for Fin Formation"; Prc. of SPIE; vol. 9049; p. 904909-1-904909-12; 2014.

*Primary Examiner* — Caleen Sullivan
(74) *Attorney, Agent, or Firm* — Cantor Colburn LLP; Vazken Alexanian

(57) ABSTRACT

Forming a dummy gate on a semiconductor device is disclosed. A first sacrificial layer is formed on a fin, and a second sacrificial layer is formed on the first sacrificial layer. A first hardmask layer is formed on the second sacrificial layer, and a second hardmask layer is formed on the first hardmask layer and patterned. The first hardmask layer is laterally recessed in a lateral direction under the second hardmask layer. The first and second sacrificial layers are etched to a corresponding width of the first hardmask layer. A spacer layer is formed on the fin, the first sacrificial layer, second sacrificial layer, the first hardmask layer and the second hardmask layer. The spacer layer is etched until it remains on a sidewall of the first sacrificial layer, the second sacrificial layer and the first hardmask layer, wherein the first and second sacrificial layers form the dummy gate.

18 Claims, 18 Drawing Sheets

(51) Int. Cl.
*H01L 29/66* (2006.01)
*H01L 29/06* (2006.01)
*H01L 29/49* (2006.01)
*H01L 21/02* (2006.01)

(52) U.S. Cl.
CPC .. *H01L 21/28247* (2013.01); *H01L 21/31116* (2013.01); *H01L 21/31144* (2013.01); *H01L 29/0657* (2013.01); *H01L 29/4916* (2013.01); *H01L 29/66545* (2013.01); *H01L 29/66795* (2013.01)

(58) Field of Classification Search
USPC ................ 257/619, 506, 5; 438/692, 128
See application file for complete search history.

(56) References Cited

U.S. PATENT DOCUMENTS

| | | |
|---|---|---|
| 7,902,000 B2 | 3/2011 | Anderson et al. |
| 8,906,760 B2 | 12/2014 | Ranjan et al. |
| 9,048,260 B2 | 6/2015 | Jhaveri et al. |
| 9,099,401 B2 | 8/2015 | He et al. |
| 9,240,412 B2 | 1/2016 | Xie et al. |
| 2006/0177977 A1 | 8/2006 | Chan et al. |
| 2008/0079060 A1 | 4/2008 | Zhu |
| 2009/0068838 A1* | 3/2009 | Kim ............... H01L 21/0337 438/692 |
| 2011/0305074 A1* | 12/2011 | Lung ............... H01L 27/2445 365/163 |
| 2014/0027878 A1* | 1/2014 | Tseng ............. H01L 21/0334 257/506 |
| 2016/0181321 A1* | 6/2016 | Jung ................ H01L 45/06 257/4 |

* cited by examiner

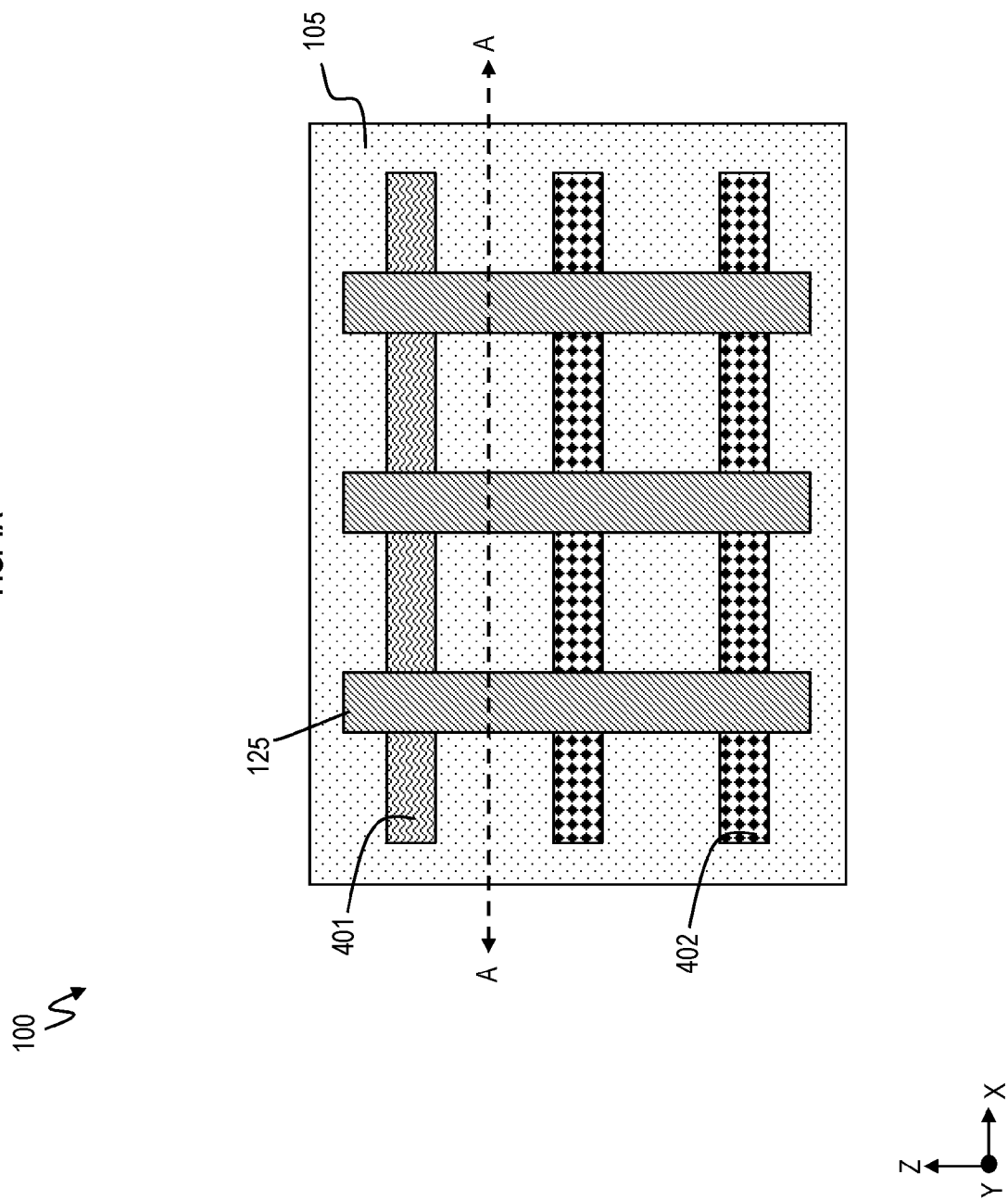

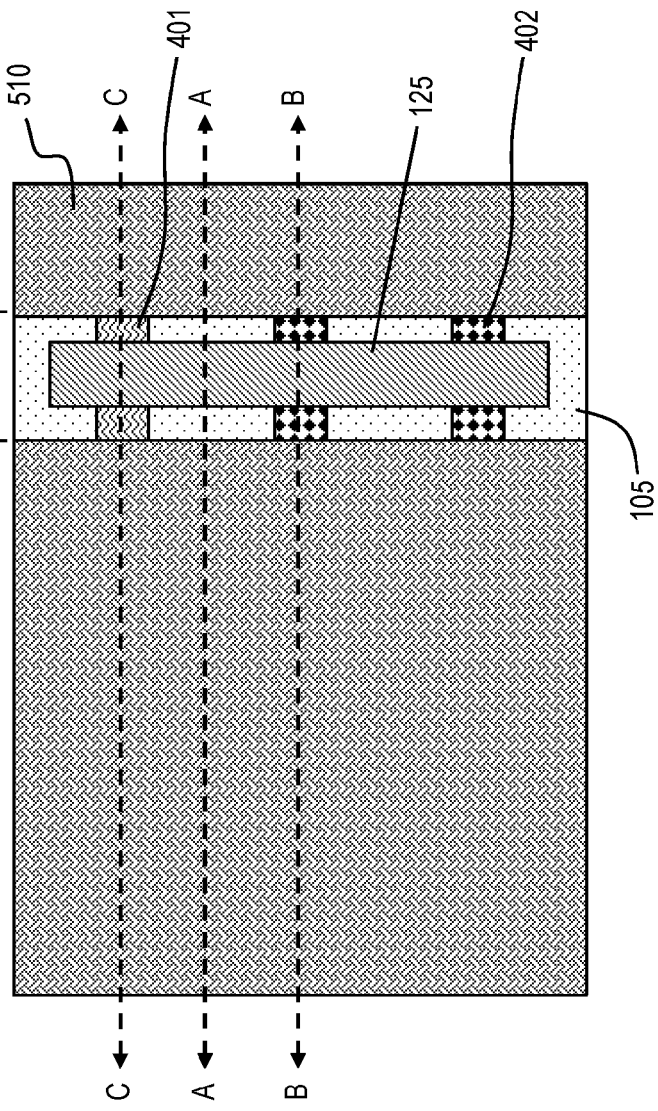
FIG. 5A
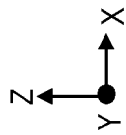

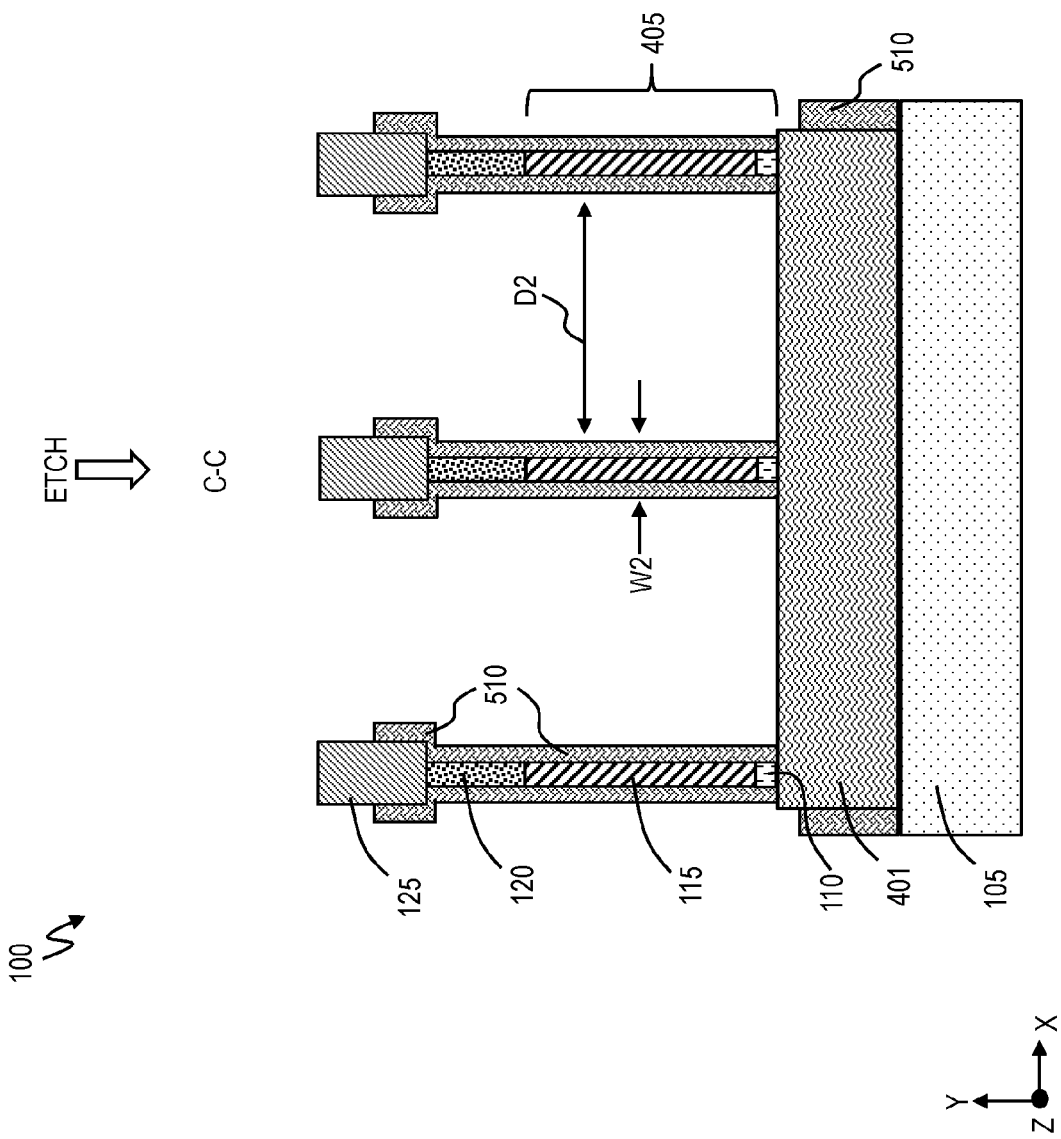

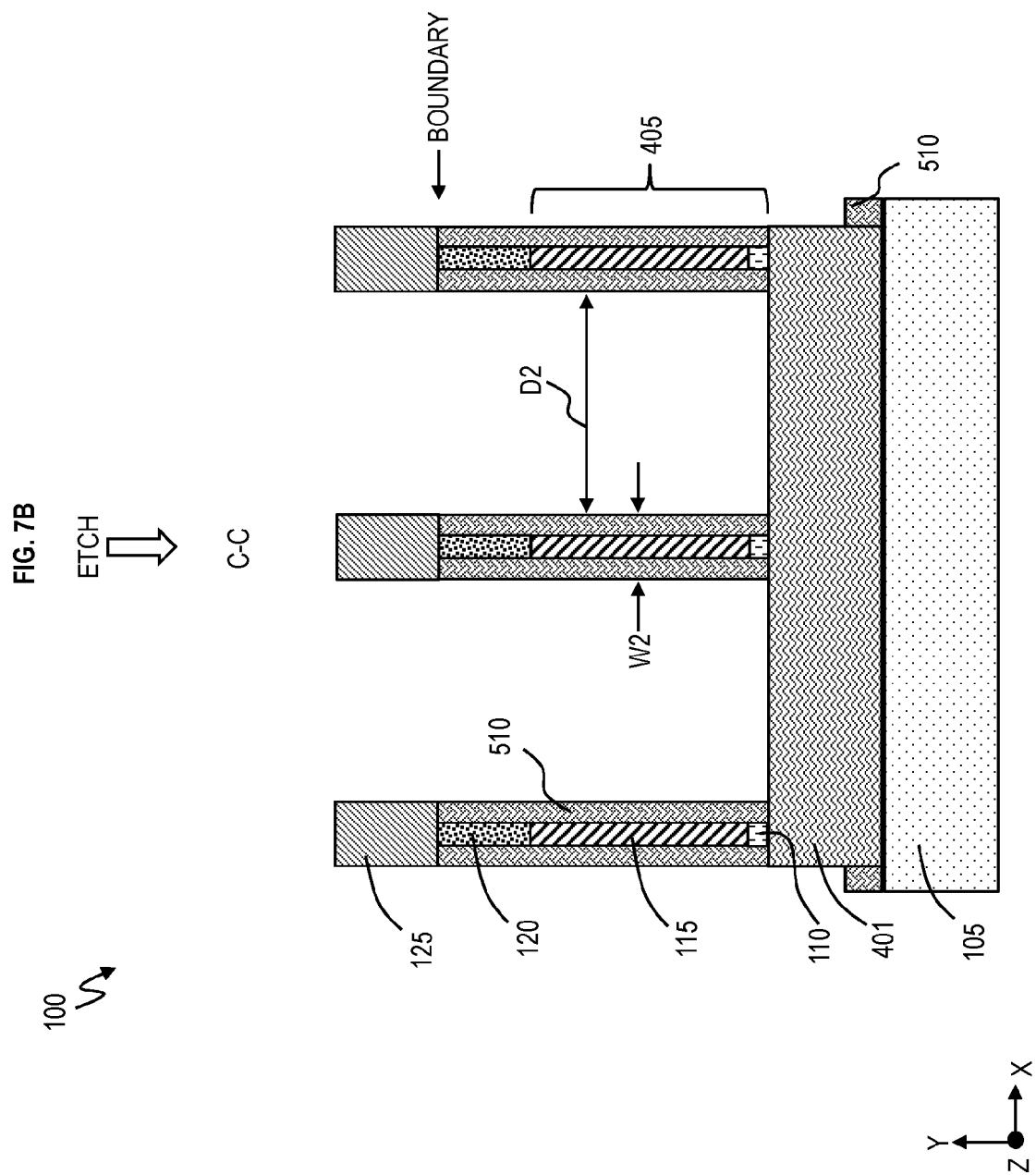

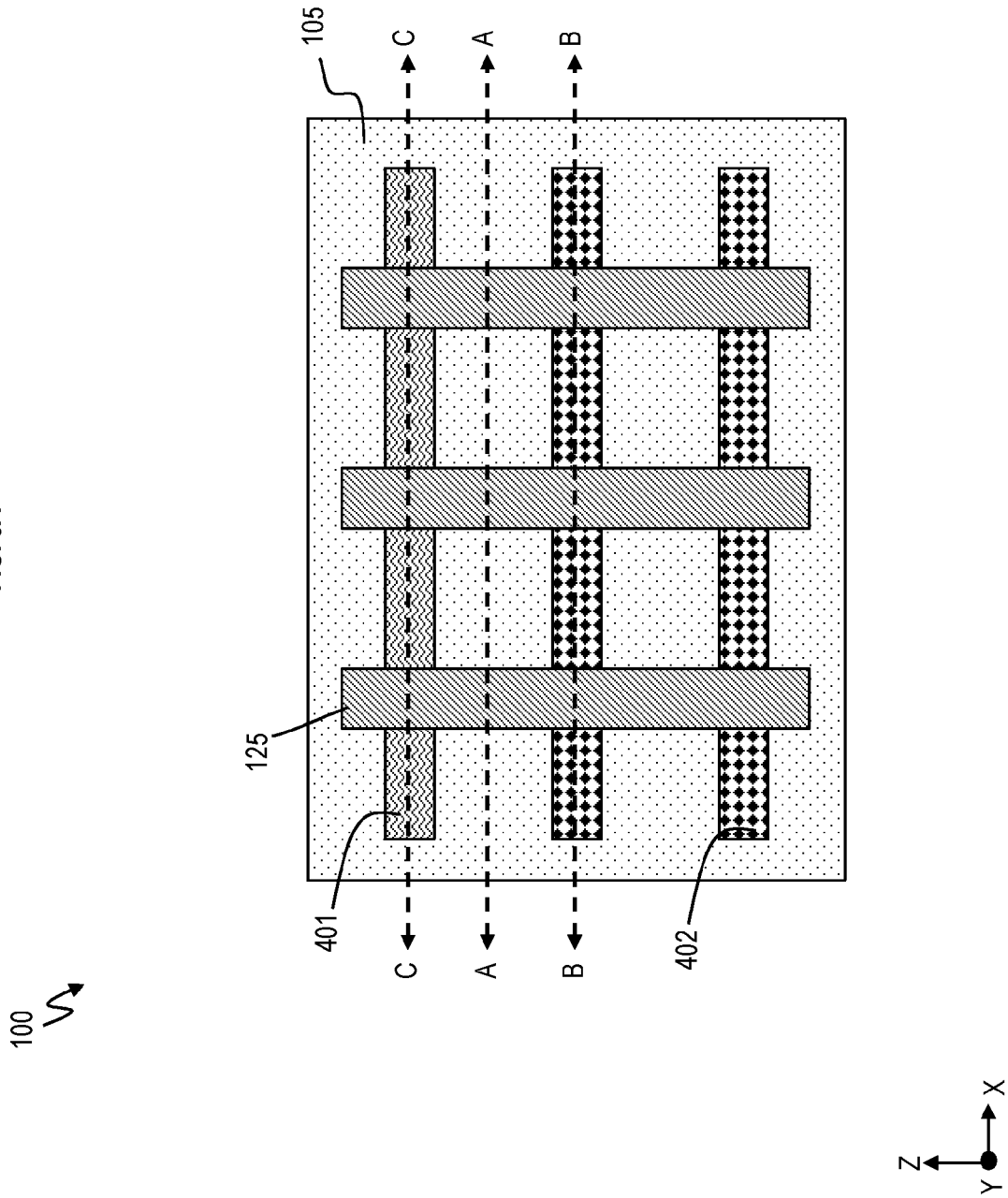

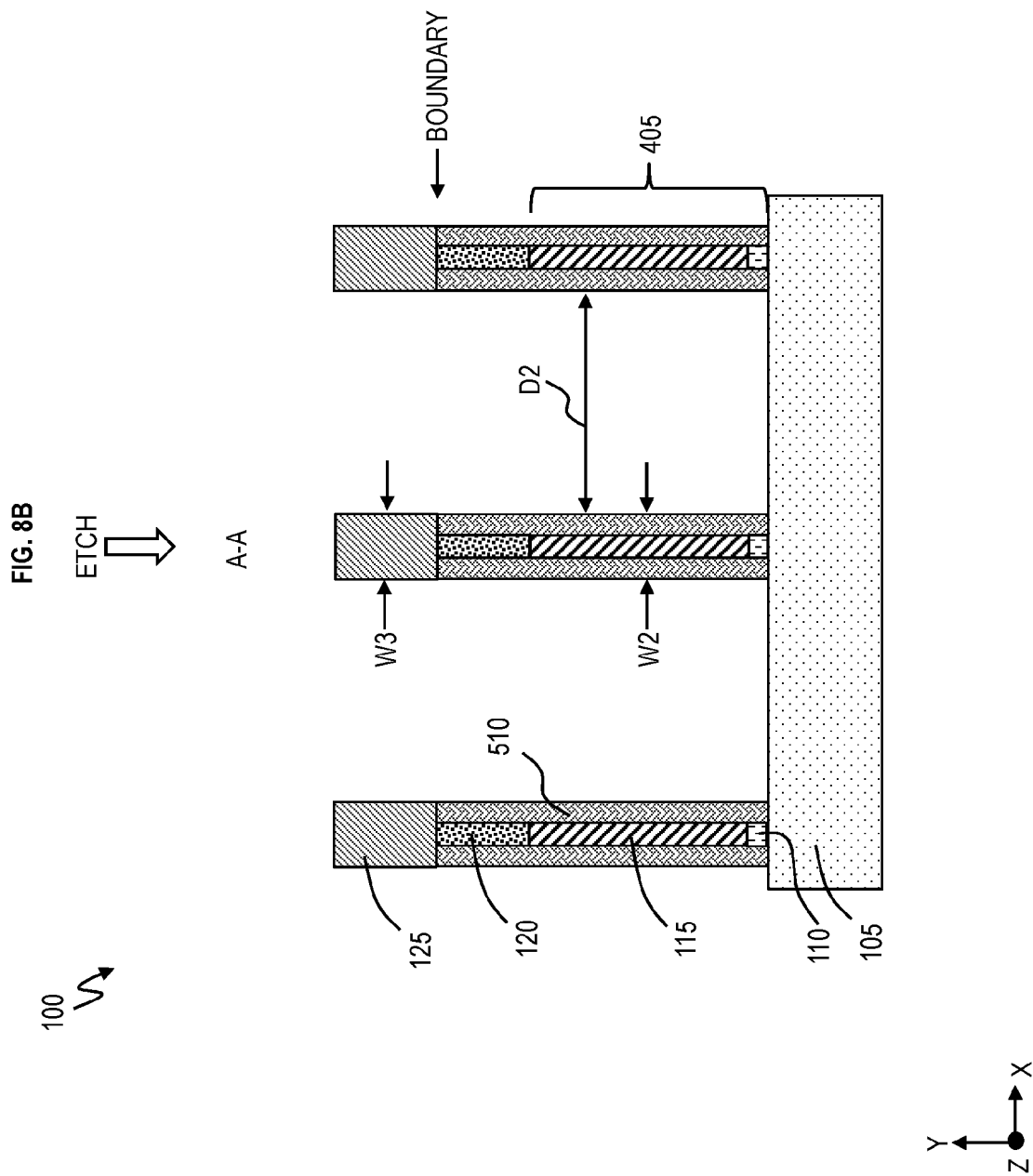

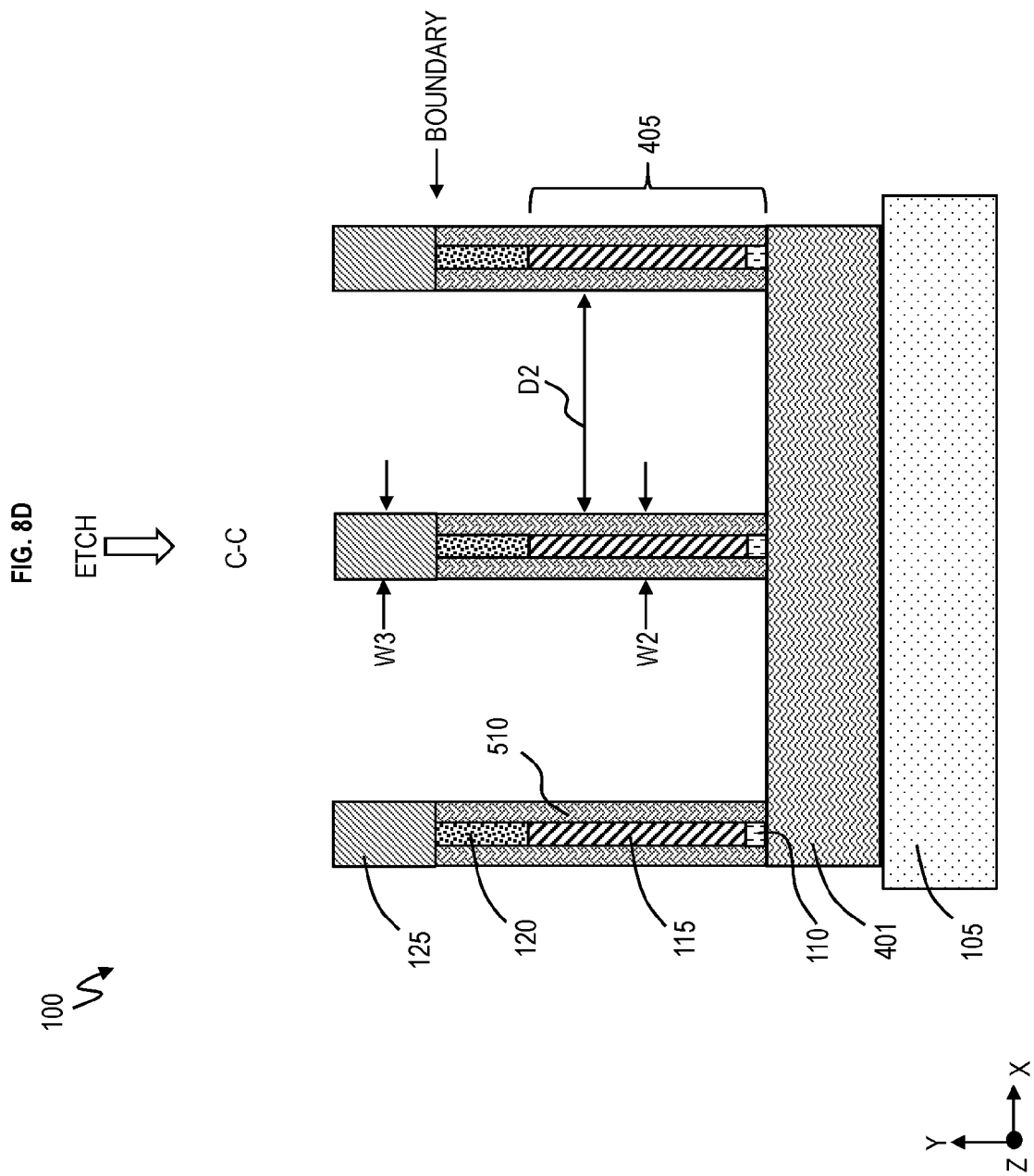

FORM A SPACER LAYER, THE SPACER LAYER BEING ON A FIN, THE DUMMY GATE, A FIRST HARDMASK LAYER, AND A SECOND HARDMASK LAYER, WHERE THE DUMMY GATE IS DISPOSED ON TOP OF THE FIN, THE FIRST HARDMASK LAYER IS DISPOSED ON TOP OF THE DUMMY GATE, AND THE SECOND HARDMASK LAYER IS DISPOSED ON TOP OF THE FIRST HARDMASK LAYER, WHERE THE FIRST HARDMASK LAYER IS LATERALLY RECESSED  1005

CONTINUOUSLY PULL DOWN THE SPACER LAYER UNTIL THE SPACER LAYER REMAINS ON A SIDEWALL OF THE DUMMY GATE AND THE FIRST HARDMASK LAYER, WHERE PULLING DOWN THE SPACER LAYER STOPS AT A BOUNDARY FORMED BETWEEN THE FIRST HARDMASK LAYER AND THE SECOND HARDMASK LAYER  1010

DUMMY GATE FORMATION USING SPACER PULL DOWN HARDMASK

BACKGROUND

The present invention relates to semiconductors, and more specifically, to a method for dummy gate formation using a spacer pull down hardmask.

A metal-oxide-semiconductor field-effect transistor (MOSFET) is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on"). A fin type field effect transistor (FET) is a type of MOSFET. FinFET devices include an arrangement of fins disposed on a substrate. The fins are formed from a semiconductor material. A gate stack is arranged over the fins and defines a channel region of the fins, while regions of the fins extending outwardly from the channel region define active source and drain regions of the device. Various state-of-the-art techniques may be used for forming the fin.

The gate stack may be formed by first forming a dummy gate stack. A dummy gate stack may be formed by depositing a conformal dummy gate material over a hardmask layer, the fins, and a substrate. The dummy gate material is patterned using a lithographic etching process to define a dummy gate stack by removing portions of the dummy gate material to expose source and drain regions of the fins.

SUMMARY

According to one or more embodiments, a method of forming a dummy gate on a semiconductor device is provided. The method includes forming a first sacrificial layer on a fin, a second sacrificial layer on the first sacrificial layer, a first hardmask layer on the second sacrificial layer, and a second hardmask layer on the first hardmask layer. The method includes patterning the first and second hardmask layers, laterally recessing the first hardmask layer in a lateral direction under the second hardmask layer, and etching the first sacrificial layer and the second sacrificial layer to a corresponding width of the first hardmask layer. Also, the method includes forming a spacer layer on the fin, the first sacrificial layer, the second sacrificial layer, the first hardmask layer, and the second hardmask layer. Further, the method includes etching the spacer layer until the spacer layer remains on a sidewall of the first sacrificial layer, the second sacrificial layer, and the first hardmask layer, where the first and second sacrificial layers form the dummy gate.

According to one or more embodiments, a method of pulling down a spacer layer for a dummy gate is provided. The method includes forming a spacer layer, the spacer layer being on a fin, the dummy gate, a first hardmask layer, and a second hardmask layer. The dummy gate is disposed on top of the fin, the first hardmask layer is disposed on top of the dummy gate, and the second hardmask layer is disposed on top of the first hardmask layer. The first hardmask layer is laterally recessed. Also, the method includes continuously pulling down the spacer layer until the spacer layer remains on a sidewall of the dummy gate and the first hardmask layer. Pulling down the spacer layer stops at a boundary formed between the first hardmask layer and the second hardmask layer.

According to one or more embodiments, a dummy gate of a semiconductor device is provided. The semiconductor device includes a first sacrificial layer on a fin, a second sacrificial layer on the first sacrificial layer, a first hardmask layer on the second sacrificial layer, and a second hardmask layer on the first hardmask layer. The first hardmask layer has been laterally recessed under the second hardmask layer, and the first sacrificial layer and the second sacrificial layer correspond to the first hardmask layer having been laterally recessed. The semiconductor device includes a spacer layer formed on the first sacrificial layer, the second sacrificial layer, and the first hardmask layer. The spacer layer is below the second hardmask layer such that a top of the spacer layer is at a boundary of the first hardmask layer and the second hardmask layer. The first sacrificial layer and the second sacrificial layer form the dummy gate.

BRIEF DESCRIPTION OF THE DRAWINGS

FIG. 4A is a top view of the structure depicting patterning the sacrificial dummy gate stack according to one or more embodiments.

FIG. 5A is a top view of the structure depicting spacer deposition according to one or more embodiments.

FIG. 6B is a cross-sectional view of the structure depicting etching the spacer material back according to one or more embodiments.

FIG. 7B is a cross-sectional view of the structure depicting further etching the spacer material back according to one or more embodiments.

FIG. 8A is a top view of the structure depicting even further etching the spacer material back according to one or more embodiments.

FIG. 8B is a cross-sectional view of the structure depicting even further etching the spacer material back according to one or more embodiments.

FIG. 8D is a cross-sectional view of the structure depicting even further etching the spacer material back according to one or more embodiments.

FIG. 10 is a flow chart of a method of pulling down a spacer layer for a dummy gate on a semiconductor device according to one or more embodiments.

DETAILED DESCRIPTION

Figure 1:
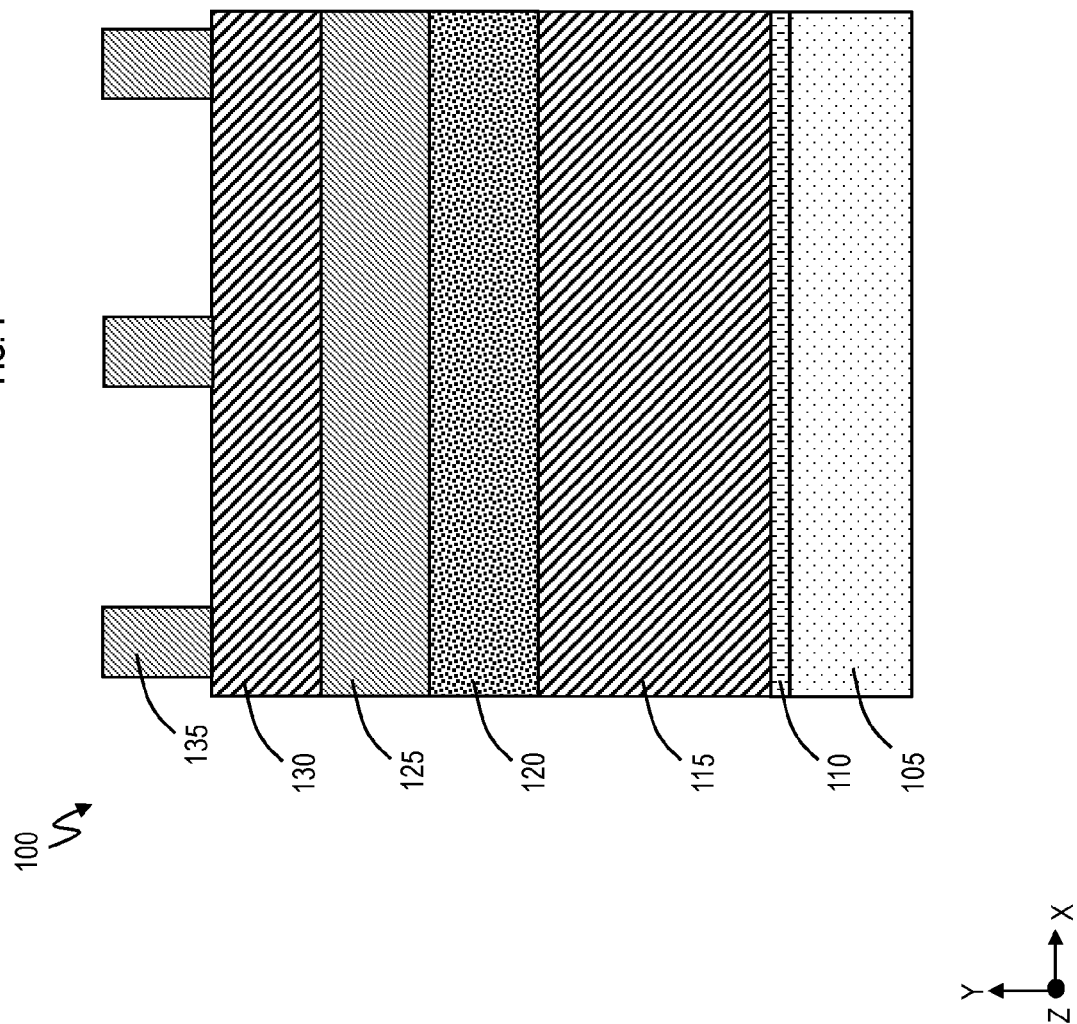
FIG. 1 is a cross-sectional view of a structure according to one or more embodiments.

Various embodiments are described herein with reference to the related drawings. Alternative embodiments may be devised without departing from the scope of this document. It is noted that various connections and positional relationships (e.g., over, below, adjacent, etc.) are set forth between elements in the following description and in the drawings. These connections and/or positional relationships, unless specified otherwise, may be direct or indirect, and are not intended to be limiting in this respect. Accordingly, a coupling of entities may refer to either a direct or an indirect coupling, and a positional relationship between entities may be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

A tall (i.e., height>width) hardmask is required to allow spacer pull down during spacer etch back so as to not recess below the top of the dummy gate. With a desire for increasing fin height, this requires an even taller hardmask because more of the spacer at the top of the dummy gate will be removed while etching the spacer along the fin. Increasing the height of the hardmask layer increases the aspect ratio of the dummy gate thereby increasing the difficulty of the dummy gate stack etch. If the spacer is recessed below the top of the amorphous silicon sacrificial gate, epitaxial nodule growth issues will arise downstream during the replacement metal gate (RMG) process.

One or more embodiments provide a novel structure and method that recesses a silicon nitride (SiN) hardmask layer underneath an oxide ($O_x$) hardmask layer to create a protective hat on top of a spacer, once the spacer has been etched beyond the SiN/$O_x$ boundary. By protecting the spacer at the top of the dummy gate using the protective hat, the fin height becomes inconsequential to spacer pull down at the top of the dummy gate because the oxide hardmask prevents further pull down of the spacer. This increases the process window for future technologies, and reduces the high aspect ratio of the replacement gate (because the height of the oxide hardmask is not defined as the height of the fin). Accordingly, this spacer pull down technique supports current equal spacer integration.

Now turning to the figures, FIGS. 1-8D illustrate a process flow of fabricating a dummy gate stack, which may also be referred to as a dummy gate, replacement gate stack, replacement gate, etc., according to one or more embodiments.

FIG. 1 is a cross-sectional view of a structure 100 according to one or more embodiments. The structure 100 is a semiconductor device configured with one or more dummy gates as discussed further herein. A first sacrificial layer 110 is disposed on top of a substrate 105. The structure 100 may be a finFET device. The substrate 105 has fins that are not shown in FIG. 1. In one implementation, the substrate 105 may be silicon.

The first sacrificial layer 110 is a protective layer that protects the substrate 105 during processing of the dummy gate. In one implementation, the first sacrificial layer 110 may be an oxide material such as, for example, silicon dioxide ($SiO_2$). In one implementation, the first sacrificial layer 110 may have a height (i.e., thickness) ranging from about 1-10 nm in the y-axis.

A second sacrificial layer 115 is disposed on top of the first sacrificial layer 110. In one implementation, the second sacrificial layer 115 may be amorphous silicon (aSi). The second sacrificial layer 115 may have a height ranging from about 80-220 nm in the y-axis. In one implementation, the second sacrificial layer 115 may have a height of about 250 nm in the y-axis.

A first hardmask layer 120 is disposed on top of the second sacrificial layer 115. In one implementation, the first hardmask layer 120 may be a nitride such as, for example, silicon nitride (SiN). In an implementation, the first hardmask 120 may have a height ranging from about 10-100 nm in the y-axis.

A second hardmask layer 125 may be disposed on top of the first hardmask layer 120. In one implementation, the second hardmask layer 125 may be an oxide such as, for example, silicon dioxide ($SiO_2$). In an implementation, the second hardmask layer 125 may have a height ranging from about 30-100 nm in the y-axis. The first hardmask layer 120 and the second hardmask layer 125 together form a bilayer hardmask. The first hardmask layer 120 and the second hardmask layer 125 may be dielectric materials.

A layer 130 may be disposed on top of the second hardmask layer 125. In one implementation, the layer 130 may be amorphous silicon. The layer 130 may have a height ranging from about 30-100 nm in the y-axis. The layer 30 may be considered a third hardmask layer.

A transfer layer 135 is disposed on top of the layer 130. The transfer layer 135 is patterned into one or more blocks. Each of the transfer layer blocks 135 may have a height ranging from about 50-150 nm in the y-axis. The transfer layer blocks 135 may each have a width ranging from about 5-50 nm in the x-axis. The width of the gate spacer discussed below is based on the width of the transfer layer blocks 135. The pattern of the transfer layer blocks 135 is to be transferred to layers below as discussed herein.

In one implementation, the transfer layer blocks 135 may be an oxide, such as, for example, silicon dioxide. The transfer layer blocks 135 may be formed by sidewall image transfer as understood by one skilled in the art. In one implementation, the transfer layer blocks 135 may formed by patterning a photoresist material, which is on top of an anti-reflective coating that is on top of an organic planarizing layer (OPL) that is on top of a mandrel. The mandrel is patterned according to the patterned photoresist material and the transfer layer is deposited on top of the patterned mandrels. The structure is planarized down to the top of the patterned mandrels, and the mandrels are removed to leave the transfer layer blocks 135.

Figure 2:
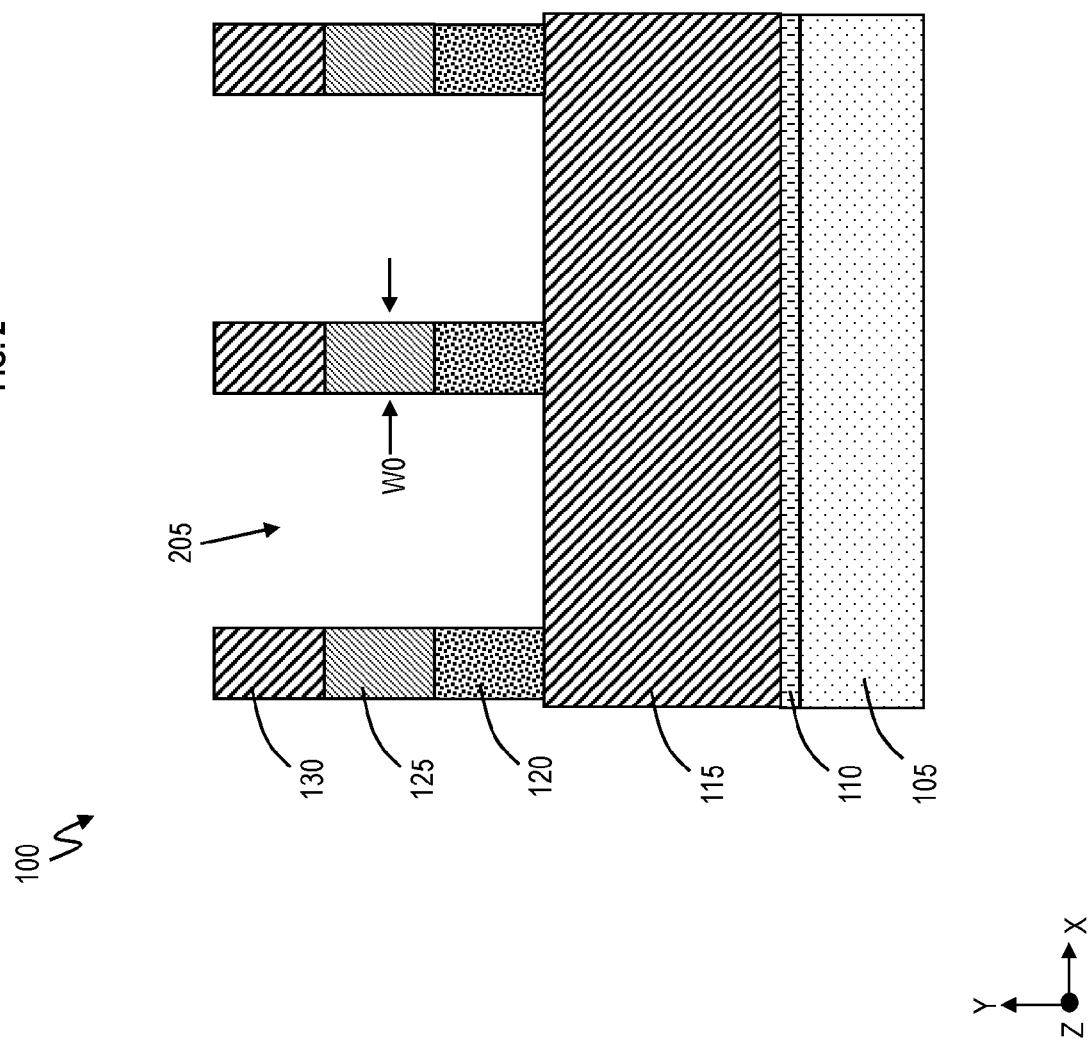
FIG. 2 is a cross-sectional view of the structure depicting opening layers according to one or more embodiments.

FIG. 2 is a cross-sectional view of the structure 100 depicting opening layers according to one or more embodiments. The layer 130 (third hardmask), the second hardmask layer 125, and first hardmask layer 120 are opened according to the pattern of the transfer layer blocks 135. For example, the pattern of the transfer layer blocks 135 may be transferred by etching the layer 130, second hardmask layer 125, and first hardmask layer 120. The layer 130, second hardmask layer 125, and first hardmask layer 120 may be etched to a width W0 that corresponds to the width of the transfer layer blocks 135. Accordingly, the width W0 may range from about 10-50 nm in the x-axis. The transfer layer blocks 135 are removed.

Figure 3:
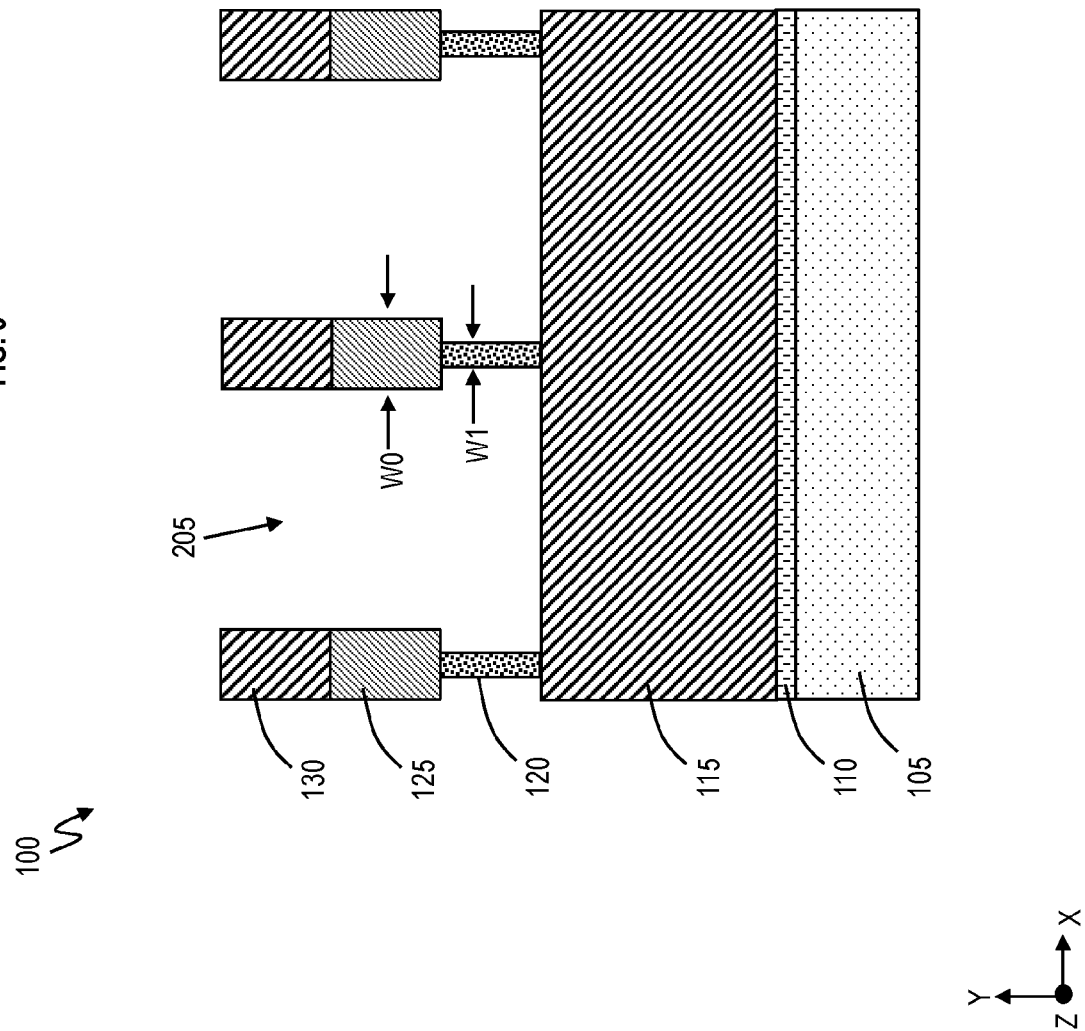
FIG. 3 is a cross-sectional view of the structure depicting a lateral recess of a first hardmask layer under a second hardmask layer equal to that of the spacer deposition thickness according to one or more embodiments.

According to one or more embodiments, FIG. 3 is a cross-sectional view of the structure 100 depicting a (SiN) lateral recess of the first hardmask layer 120 under the (oxide) second hardmask layer 125 equal to that of the spacer deposition thickness using an (SiN) isotropic etch that is selective to oxide and amorphous silicon. For example, an etchant may be used that laterally etches the (SiN) first hardmask layer 120 in the x-axis while not etching (or etching at a much slower rate) the (oxide) second hardmask layer 125 and the amorphous silicon layer 130. An example etchant may be a $CF_4$ (carbon tetrafluoride) based plasma, or similar wet etch process. The first hardmask layer 120 has been laterally recessed to a width W1. The width W0 is greater than the width W1. The width W1 may range from 5-49 nm in the x-axis.

FIG. 4A is a top view of the structure 100 depicting removal of the layer 130 (e.g., the third hardmask) according to one or more embodiments. In the top view, FIG. 4A shows that fins 401 and 402 extend horizontally in the x-axis while the second hardmask layer 125 are patterned rows that extend in the z-axis. The fins 401, 402 are on top of the substrate 105. The fin 401 is illustrated as a p-FET fin and the fins 402 are illustrated as n-FET fins. The p-FET fin 401 may be silicon or silicon germanium doped with dopants to facilitate hole current. The n-FET fins 402 may be silicon doped with dopants to facilitate electron current.

Figure 4B:
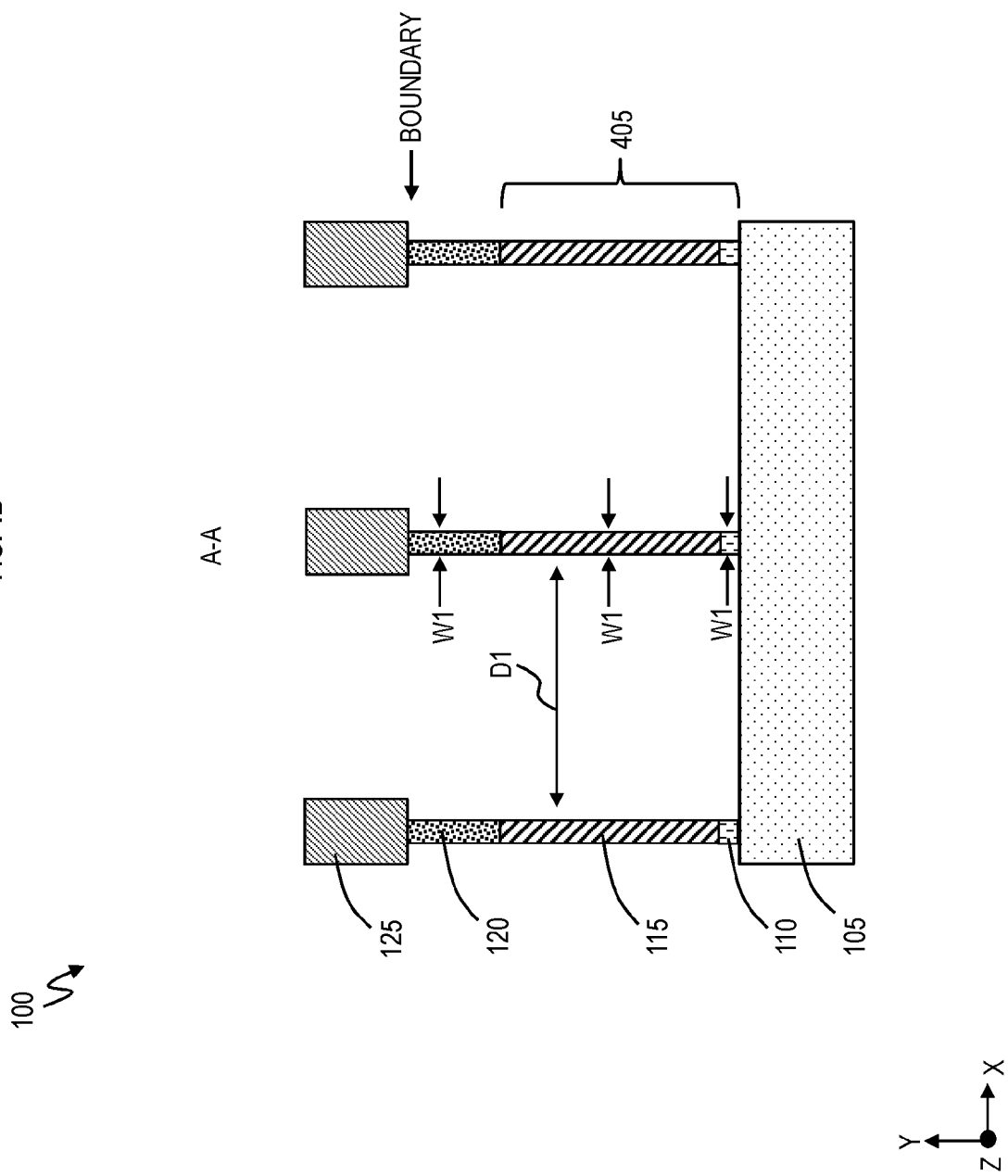
FIG. 4B is a cross-sectional view of the structure depicting patterning the sacrificial dummy gate stack according to one or more embodiments.

The laterally recessed first hardmask 120, along with the patterned second sacrificial layer 115 and first sacrificial layer 110, is underneath the second hardmask 125 as seen in FIG. 4B.

FIG. 4B is a cross-sectional view of the structure 100 depicting patterning the sacrificial dummy gate stack with a predetermined critical dimension that is equal to or about equal to the width W1 (in the x-axis) of the (SiN) first hardmask 120 that has been recessed according to one or more embodiments. The cross-sectional view is taken along the line A-A.

The first sacrificial layer 110 and the second sacrificial layer 115 together form the sacrificial dummy gate stack 405 (i.e., the dummy gate). The sacrificial dummy gate stack 405 is under the first hardmask layer 120 and the second hardmask layer 125. The spacing between each of the sacrificial dummy gate stacks 405 is equal and is designated D1. Only 3 sacrificial dummy gate stacks 405 are shown for explanation purposes, and it is appreciated that more dummy gate stacks 405 may be formed using the technique discussed herein.

The second sacrificial layer 115 has been etched to the width W1 according to the first hardmask layer 120. An example etchant used to laterally etch sacrificial layer 115 may be a hydrogen bromine, chlorine, and/or fluorine plasma. The third hardmask layer 130 is removed during the etching of sacrificial layer 115. After sacrificial layer 115 is etched, portions of sacrificial layer 110 that cover 105 (i.e., those areas of sacrificial layer 110 not underneath the dummy gate stacks 405) are removed with a chemical wet etch (for example, HF acid). This removal process can be tuned to retain the majority of the second hardmask layer 125 despite similar material characteristics.

FIG. 5A is a top view of the structure 100 depicting spacer deposition according to one or more embodiments. FIG. 5A shows an imaginary window 501 to illustrate layers underneath a spacer layer 510. It should be recognized that the imaginary window 501 is not actually present but is employed for explanation purposes.

Figure 5B:
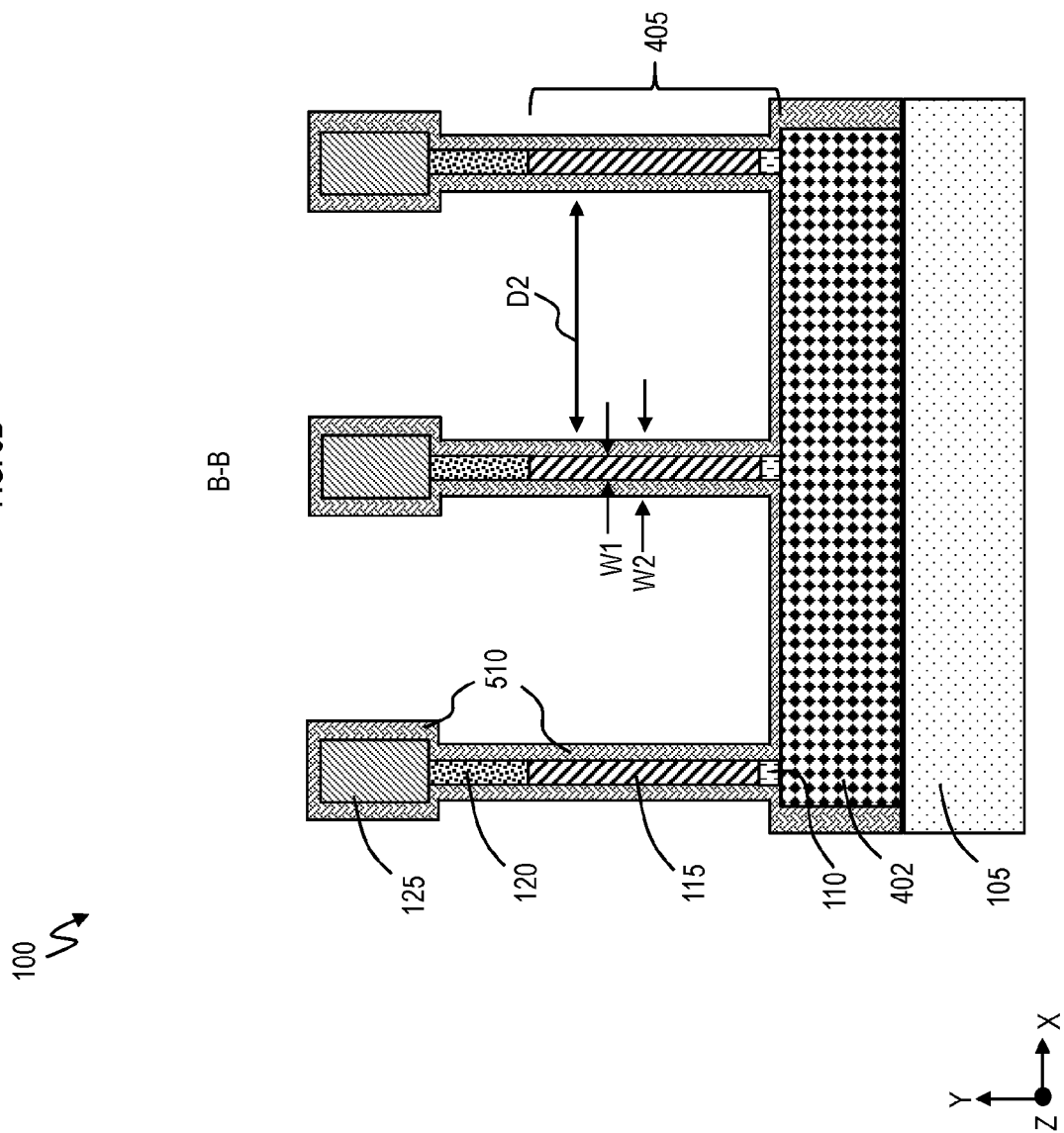
FIG. 5B is a cross-sectional view of the structure depicting spacer deposition according to one or more embodiments.
Figure 5C:
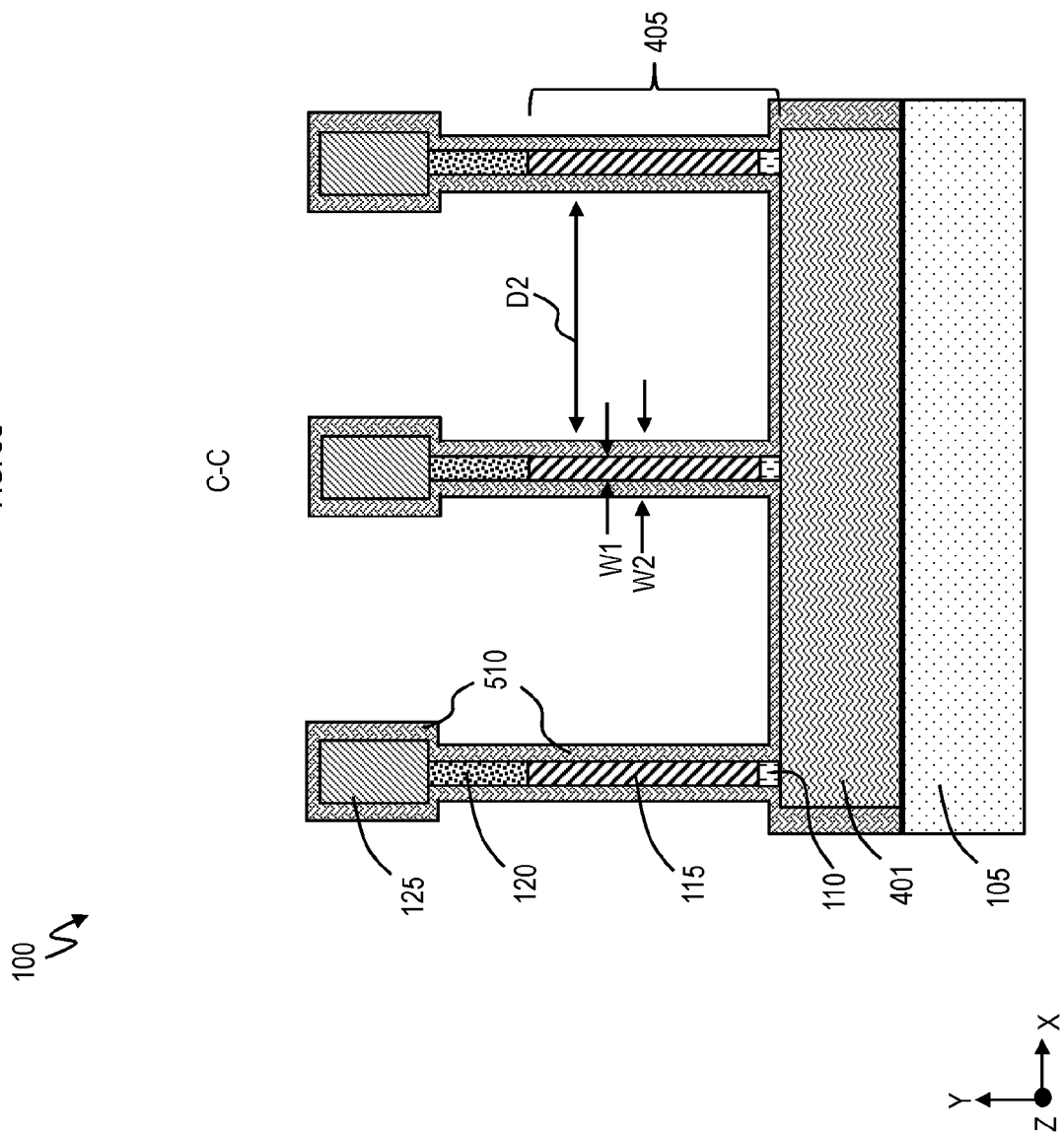
FIG. 5C is a cross-sectional view of the structure depicting spacer deposition according to one or more embodiments.

FIG. 5B is a cross-sectional view of the structure 100 depicting spacer deposition according to one or more embodiments. FIG. 5B is a cross-sectional view taken along the line B-B in FIG. 5A. FIG. 5C is a cross-sectional view of the structure 100 depicting spacer deposition according to one or more embodiments. FIG. 5C is a cross-sectional view taken along the line B-B in FIG. 5A.

Spacer material 510 may be deposited on the sacrificial dummy gate stack 405 (i.e., the first and second sacrificial layers 110 and 115), the first hardmask layer 120, the second hardmask layer 125, and the fins 401, 402 at the desired thickness. The spacer material 510 may be deposited by standard deposition techniques understood by one skilled in the art. After spacer deposition, the distance between the spacer material 510 on the sacrificial dummy gate stack 405 is designated as D2. The distance D2 is equal spacing between the sacrificial dummy gates 405. The distance D2 is less than distance D1 by the thickness of the spacer material 510 on the (left and right) sidewalls of the dummy gate stack 405. The sacrificial dummy gate stack 405 and the spacer material 510 on the sides of the sacrificial dummy gate stack 405 have a combined width W2. As noted above, the first and second sacrificial layers 110 and 115 have the same width designated as width W1. The width W2 is greater than width W1 by the thickness of the spacer material 510 on the (left and right) sidewalls of the sacrificial dummy gate stack 405 in the x-axis.

Examples materials of the spacer material 510 may include silicon nitride, silicon boron carbon nitride (SiBCN), etc. The spacer material 510 may be a low-k dielectric material.

FIGS. 6A, 6B, 7A, 7B, 8A, 8B, 8C, and 8D are views of the structure 100 depicting spacer etch back according to one or more embodiments. FIGS. 6, 7, and 8 illustrate spacer pull down of the spacer material 510. An etchant may be utilized to etch back the spacer material 510. An example etchant may be a vertical plasma etch as described above.

Figure 6A:
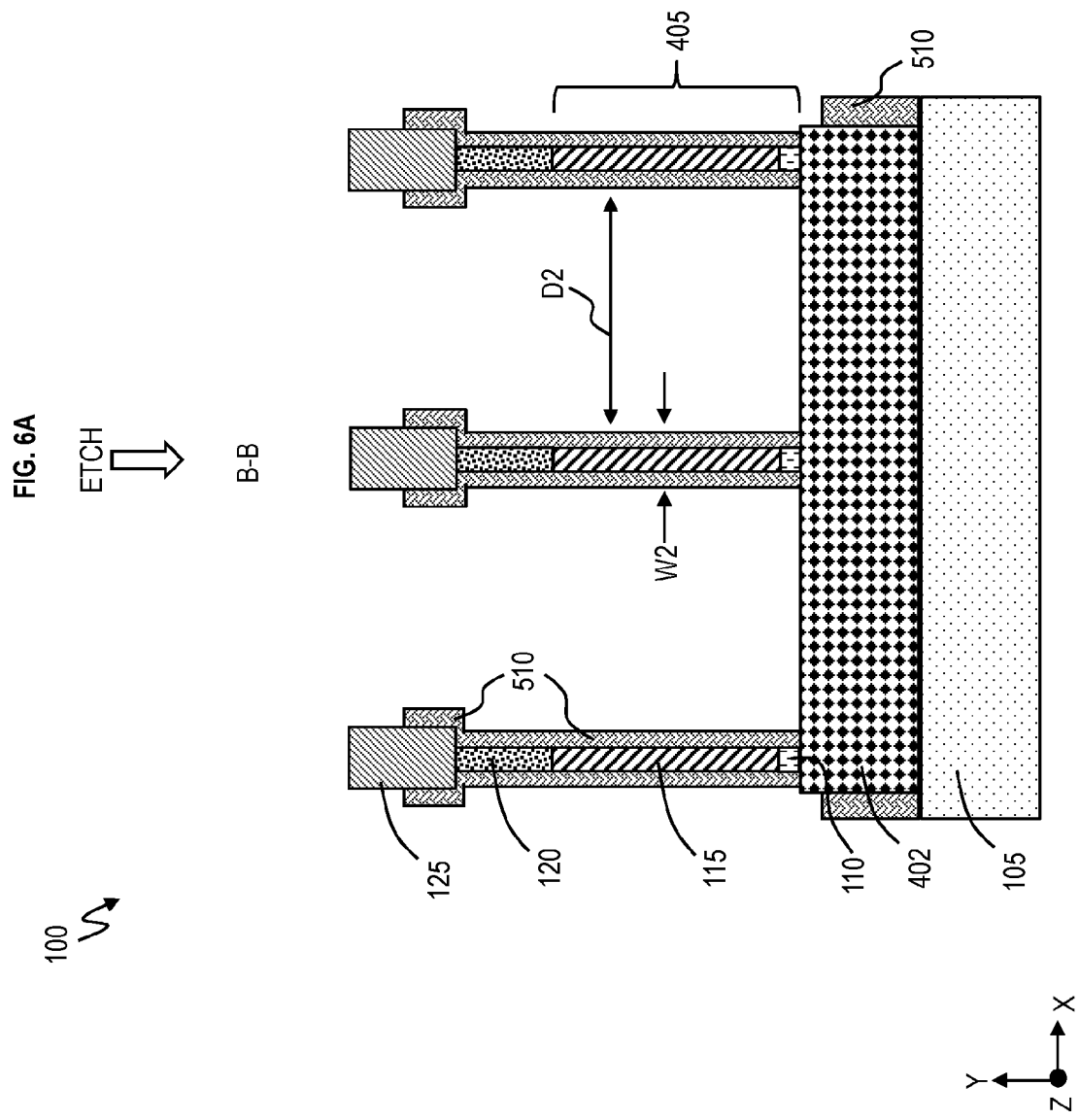
FIG. 6A is a cross-sectional view of the structure depicting etching the spacer material back according to one or more embodiments.

FIG. 6A is a cross-sectional view of the structure 100 depicting etching the spacer material 510 back an amount (e.g., a certain percentage) according to one or more embodiments. FIG. 6A represents a cross-sectional view taken along line B-B. FIG. 6B is a cross-sectional view of the structure 100 depicting etching the spacer material 510 back an amount (e.g., a certain percentage) according to one or more embodiments. FIG. 6B represents a cross-sectional view taken along line C-C.

In one implementation, the spacer material 510 may be etched back 33%. The height of the spacer material 510 may be reduced in the y-axis on the second hardmask layer 125. For example, the height of the spacer material 510 may be pulled down in the y-axis on the second hardmask layer 125 by about half. Also, the spacer material 510 is removed from the top surface of the second hardmask layer 125. The height in the y-axis of the spacer material 510 may be reduced on the fins 401, 402 such that the height of the spacer material 510 is pulled down on the sides of the fin 401, 402 and the spacer material 510 is removed from the top surface of the fins 401, 402. The height of the spacer material 510 is reduced on the substrate 105.

Figure 7A:
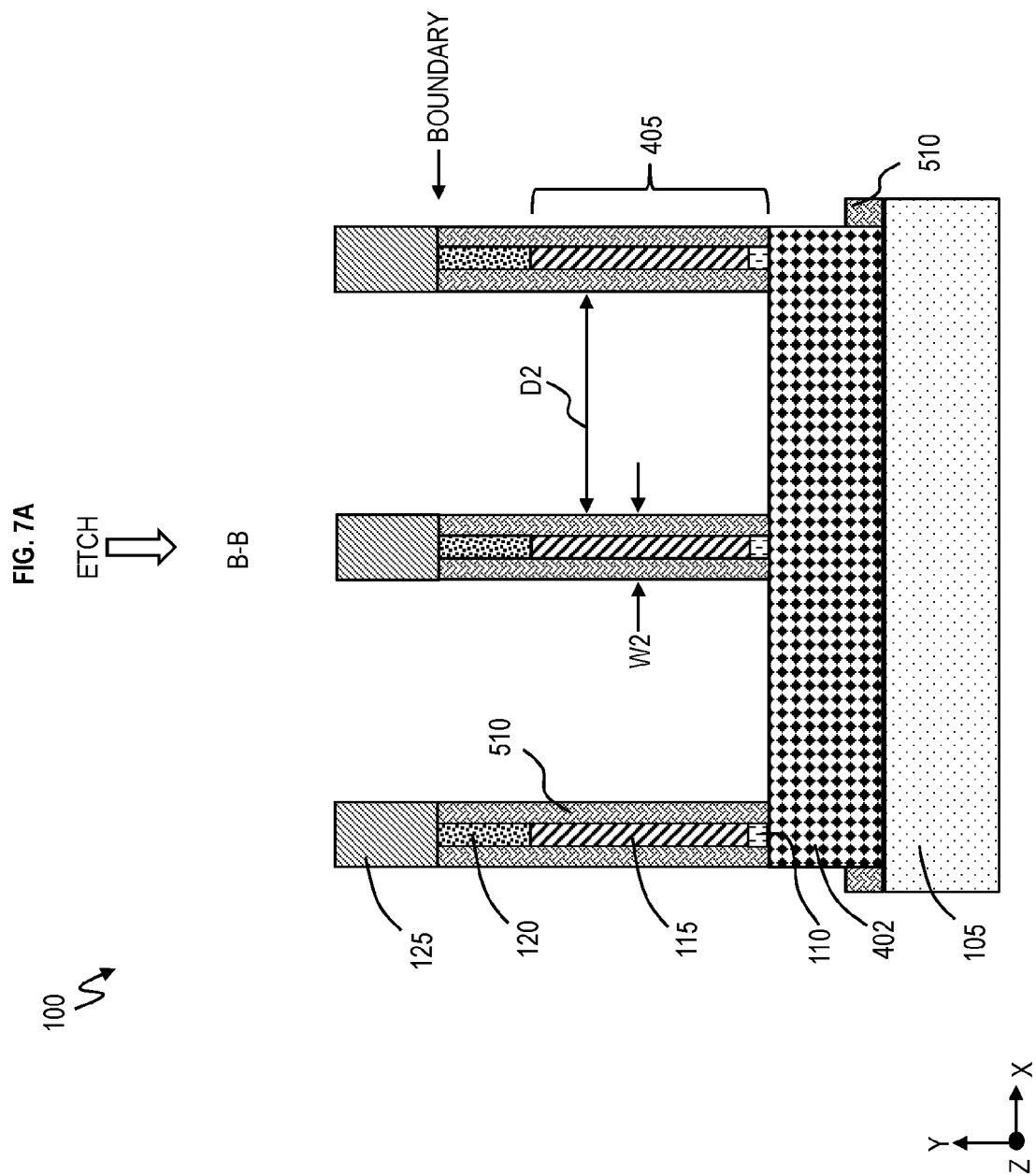
FIG. 7A is a cross-sectional view of the structure depicting further etching the spacer material back according to one or more embodiments.

FIG. 7A is a cross-sectional view of the structure 100 depicting further etching the spacer material 510 back a certain percentage according to one or more embodiments. FIG. 7A is a cross-sectional view taken along line B-B. FIG. 7B is a cross-sectional view of the structure 100 depicting further etching the spacer material 510 back a certain percentage according to one or more embodiments. FIG. 7B is a cross-sectional view taken along line C-C.

In one implementation, the spacer material 510 may be etched back 66%. In FIGS. 7A and 7B, the height in the y-axis of the spacer material 510 may be further reduced on the fins 401, 402 such that the height of the spacer material 510 is pulled down even more on the sides of the fins 401, 402. At this point, the spacer material 510 is removed from the second hardmask layer 125 and almost completely removed from the fins 401, 402. The height of the spacer material on the substrate 105 is further reduced.

FIG. 8A is a top view of the structure 100 depicting even further etching the spacer material 510 back a certain percentage according to one or more embodiments. FIG. 8B is a cross-sectional view of the structure 100 depicting even further etching the spacer material 510 back a certain percentage according to one or more embodiments.

Figure 8C:
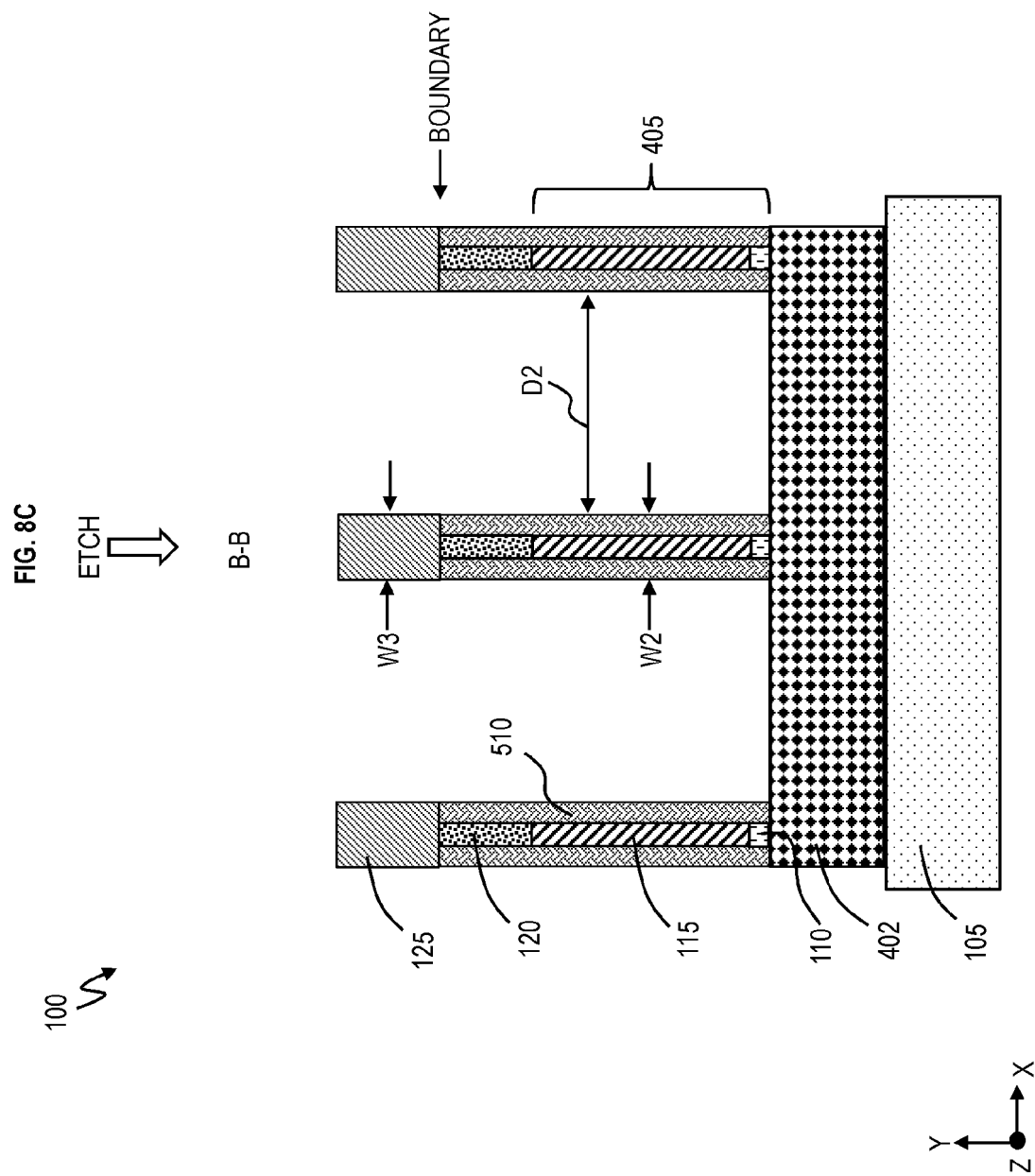
FIG. 8C is a cross-sectional view of the structure depicting even further etching the spacer material back according to one or more embodiments.

According to one or more embodiments, FIG. 8B is a cross-sectional view of the structure 100 depicting even further etching the spacer material 510 back a certain percentage, and FIG. 8B is a cross-sectional view taken along line A-A. According to one or more embodiments, FIG. 8C is a cross-sectional view of the structure 100 depicting even further etching the spacer material 510 back a certain percentage, and FIG. 8C is a cross-sectional view taken along line B-B. Also, according to one or more embodiments, FIG. 8D is a cross-sectional view of the structure 100 depicting even further etching the spacer material 510 back a certain percentage, and FIG. 8D is a cross-sectional view taken along line C-C.

The spacer material 510 may be etched back 100% in the y-axis such that the spacer material 510 is removed from sides of the fins 401, 402 and the substrate 105. The spacer material 510 only remains along the sidewall of the sacrificial dummy gate stack 405 (i.e., the first and second sacrificial layers 110 and 115) and the sidewall of the first hardmask layer 120 (silicon nitride hardmask). Although the spacer material 510 is on the sidewall of the sacrificial dummy gate stack 405 and the first hardmask 120, it is appreciated that the top surface of the spacer material 510 is underneath and against the second hardmask 125 and the bottom surface of the spacer material 510 is supported on and against the fins 401, 402.

The width W2 (of the sacrificial dummy gate stack 405 and the sidewall spacer material 510 on the sides of the sacrificial dummy gate stack 405) is about the same as and/or less than width W3 of the second hardmask layer 125. During the plasma etch, the second hardmask layer 125 acts as a protective barrier for the spacer material 510 at the top of the sacrificial dummy gate stack 405, allowing for increased fin height without having to increase the thickness/height (in the y-axis) of the second hardmask layer 125.

As discussed herein, this technique laterally recesses the (SiN) first hardmask layer 120 underneath the (oxide) second hardmask layer 125 to create a protective hat (i.e., the second hardmask layer 125) on top of the spacer material 510 once the spacer material 510 is etched beyond the SiN/O$_x$ boundary (i.e., the boundary/interface of the first hardmask layer 120 and the second hardmask layer 125). The spacer material 510 does not get pulled down below the boundary of the first and second hardmask layer 120, 125 even with further etching of the spacer material 510. This is because the protective hat of the second hardmask layer 125 protects the spacer material 510 underneath.

By protecting the spacer at the top of the sacrificial gate stack 405, the fin height of fins 401, 402 becomes inconsequential to spacer pull down at the top of the sacrificial gate stack 405, because the (oxide) second hardmask 125 prevents further pull down of the spacer material 510.

Figure 9:
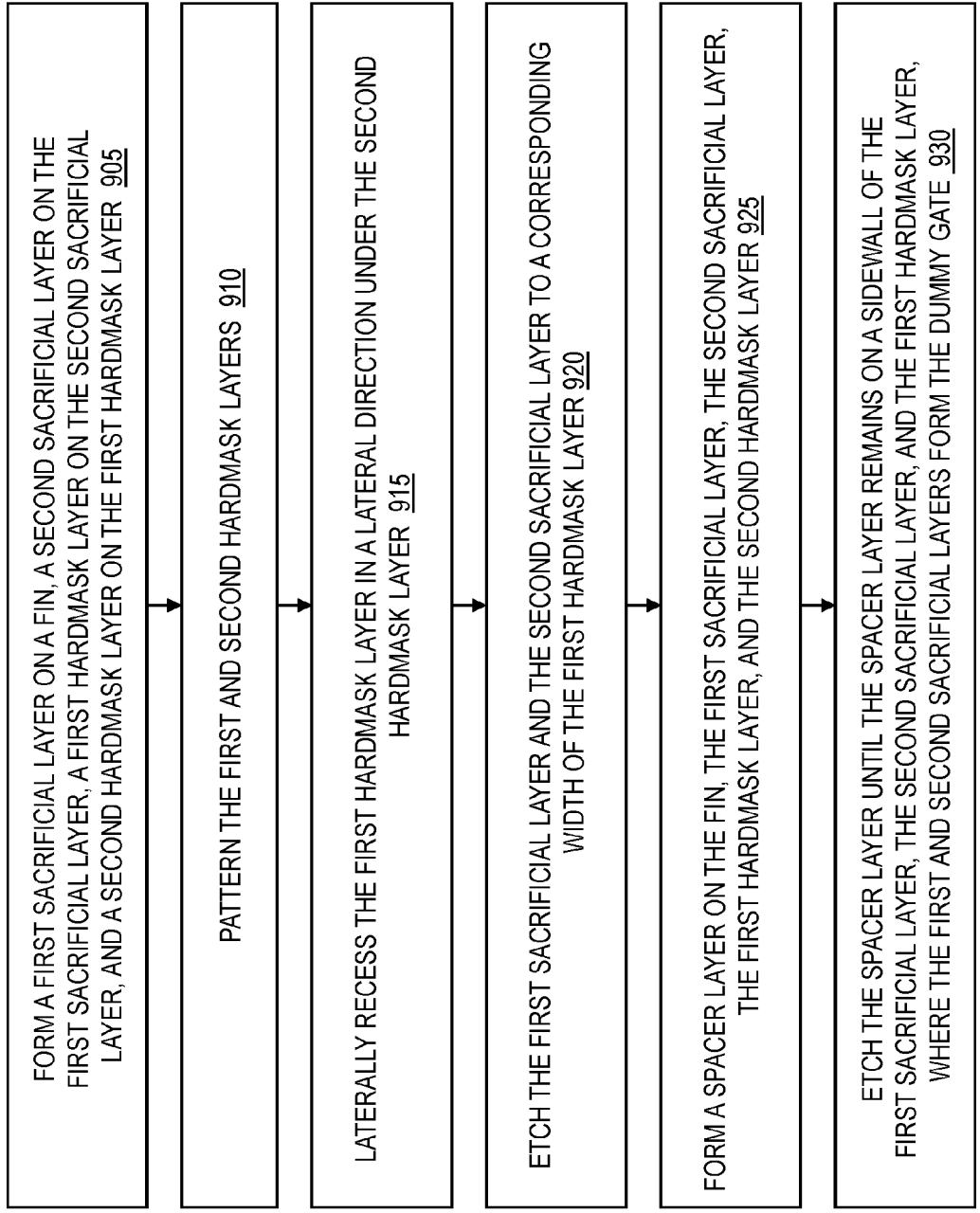
FIG. 9 is a flow chart of a method of forming a dummy gate on a semiconductor device according to one or more embodiments.

FIG. 9 is a flow chart 900 of a method of forming a dummy gate on a semiconductor device 100 according to one or more embodiments. Reference can be made to FIGS. 1-8 and 10.

At block 905, a first sacrificial layer 110 is formed on a fin 401, 402, a second sacrificial layer 115 on the first sacrificial layer 110, a first hardmask layer 120 on the second sacrificial layer 125, and a second hardmask layer 125 on the first hardmask layer 120.

At block 910, the first and second hardmask layers 120, 125 are patterned.

At block 915, the first hardmask layer 120 is laterally recessed in a lateral direction under the second hardmask layer 125.

At block 920, the first sacrificial layer 110 and the second sacrificial layer 115 are etched to a corresponding width (e.g., width W1) of the first hardmask layer 120.

At block 925, a spacer layer 510 is formed on the fin 401, 402, the first sacrificial layer 110, the second sacrificial layer 115, the first hardmask layer 120, and the second hardmask layer 125.

At block 930, the spacer layer 510 is etched until the spacer layer 510 remains on a sidewall of the first sacrificial layer 110, the second sacrificial layer 115, and the first hardmask layer 120, wherein the first and second sacrificial layers 120, 125 form the dummy gate 405.

Etching the spacer layer 510 until the spacer layer 510 remains on the sidewall of the first and second sacrificial layers 110, 115 comprises removing the spacer layer 510 from the second hardmask layer 125.

Etching the spacer layer 510 until the spacer layer 510 remains on the sidewall of the first and second sacrificial layers 110, 115 comprises further removing the spacer layer 510 from the sides of the fin 401, 402 and from a top surface of the fin 401, 402.

Etching the spacer layer 510 until the spacer layer 510 remains on the sides of the first sacrificial layer 110, the second sacrificial layer 115, and the first hardmask layer 120 causes a combined lateral dimension (width W2) of the spacer layer 510 and the dummy gate 405 to correspond to a second hardmask lateral dimension (width W0) of the second hardmask layer 125.

Etching the spacer layer 510 until the spacer layer 510 remains on the sides of the first sacrificial layer 110, the second sacrificial layer 115, and the first hardmask layer 120 comprises reducing a height of the spacer layer 510 in the y-axis.

Etching the spacer layer 510 until the spacer layer 510 remains on the sides of the first sacrificial layer 110, the second sacrificial layer 115, and the first hardmask layer 120 comprises reducing a height of the spacer layer 510 to a boundary of the first and second hardmask layers 120, 125.

When etching the spacer layer 510, the second hardmask layer 125 is a protective shield for the spacer layer 510 underneath the second hardmask layer 125 such that the spacer layer 510 under the second hardmask layer 125 is not etched.

The dummy gate 405 has the spacer layer 510 on the sides, has the first hardmask layer 120 on the top, and has the fin 401, 402 on the bottom. The first sacrificial layer includes oxide. The second sacrificial layer includes amorphous silicon. The first hardmask layer includes nitride and the second hardmask layer includes oxide.

FIG. 10 is a flow chart 1000 of a method of pulling down a spacer layer for a dummy gate of a semiconductor device 100 according to one or more embodiments. Reference can be made to FIGS. 1-9.

At block 1005, a spacer layer 510 is formed, in which the spacer layer 510 is on a fin 401, 402, the dummy gate 405, a first hardmask layer 120, and a second hardmask layer 125. The dummy gate 405 is disposed on top of the fin 401, 402, the first hardmask layer 120 is disposed on top of the dummy gate 405, and the second hardmask layer 125 is disposed on top of the first hardmask layer 120. The first hardmask layer 120 is laterally recessed.

At block 1010, the spacer layer 510 is continuously pulled down until the spacer layer 510 remains on a sidewall of the dummy gate 405 and the first hardmask layer 120, where pulling down the spacer layer 510 stops at a boundary formed between the first hardmask layer 120 and the second hardmask layer 125.

Pulling down the spacer layer until the spacer layer 510 remains on the sidewall of the dummy gate 405 and the first hardmask layer 120 comprises removing the spacer layer 510 from the second hardmask layer 125, and further removing the spacer layer 510 from sides of the fin 401, 402 and from a top surface of the fin 401, 402.

Pulling down the spacer layer until the spacer layer 510 remains on the sidewall of the dummy gate 405 and the first hardmask layer 120 causes a combined lateral dimension (width W2) of the spacer layer and dummy gate to correspond to a second hardmask lateral dimension (width W0) of the second hardmask layer. Pulling down the spacer layer until the spacer layer 510 remains on the sidewall of the dummy gate 405 and the first hardmask layer 120 comprises reducing a height of the spacer layer 510 in the y-axis.

Pulling down the spacer layer until the spacer layer 510 remains on the sidewall of the dummy gate 405 and the first hardmask layer 120 comprises reducing a height of the spacer layer to the boundary of the first and second hardmask layers.

The first hardmask layer 120 has been laterally recessed (to width W1) under the second hardmask layer 125. The first sacrificial layer and the second sacrificial layer correspond to width W1 of the first hardmask layer having been laterally recessed.

The spacer layer 510 is below the second hardmask layer (acting as a protective hat) such that a top of the spacer layer 510 is at a boundary of the first hardmask layer and the second hardmask layer. The width of the first hardmask layer 120 and the dummy gate 405 is about equal. The combined width (width W2) of the spacer layer and the dummy gate is about equal to or less than a width W0 of the second hardmask layer.

Further processing of the structure 100 may occur as understood by one skilled in the art. It should be appreciated that a p-FET type silicon may be epitaxially grown on the p-FET fin 401 and n-FET type silicon may be epitaxially grown on the n-FET fin 402.

Also, it should be appreciated that the dummy gate 405 may be replaced using a replacement metal gate (RMG) process as understood by one skilled in the art. After the first hardmask layer 120 and second hardmask layer 125 have been removed, the first and second sacrificial layers 110 and 115 may be replaced with a high-k dielectric layer. A first work function metal may be formed on the high-k dielectric layer, and a second work function metal may be formed on the first work function metal.

Technical effects and benefits include improved semiconductor devices, including, for example, improved dummy gate stacks. Technical benefits provide a novel structure and method that recesses a silicon nitride (SiN) hardmask layer underneath an oxide ($O_x$) hardmask layer to create a protective hat on top of a spacer once the spacer layer has been etched beyond the SiN/$O_x$ boundary. By protecting the spacer at the top of the dummy gate, the spacer pull down stops at the top of the dummy gate because the oxide hardmask prevents further pull down of the spacer.

It should be appreciated that the design for semiconductor devices may be included in or utilize features of an integrated circuit layout. An integrated circuit (IC) layout is also known as an IC layout, IC mask layout, or mask design. The integrated circuit layout is the representation of an integrated circuit in terms of planar geometric shapes which correspond to the patterns of metal, oxide, semiconductor layers, etc., that make up the components of the integrated circuit. Such an integrated circuit layout, including the layout of a semiconductor device, may be stored in a computer readable medium in preparation for fabrication as understood by one skilled in the art.

It will be noted that various microelectronic device fabrication methods may be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a dummy gate on a semiconductor device, the method comprising:
    forming a first sacrificial layer on a fin, a second sacrificial layer on the first sacrificial layer, a first hardmask layer on the second sacrificial layer, and a second hardmask layer on the first hardmask layer;
    patterning the first and second hardmask layers;

laterally recessing the first hardmask layer in a lateral direction under the second hardmask layer;
etching the first sacrificial layer and the second sacrificial layer to a corresponding width of the first hardmask layer;
forming a spacer layer on the fin, the first sacrificial layer, the second sacrificial layer, the first hardmask layer, and the second hardmask layer; and
etching the spacer layer until the spacer layer remains on a sidewall of the first sacrificial layer, the second sacrificial layer, and the first hardmask layer, wherein the first and second sacrificial layers form the dummy gate.

2. The method of claim 1, wherein etching the spacer layer until the spacer layer remains on the sidewall of the first and second sacrificial layers comprises removing the spacer layer from the second hardmask layer.

3. The method of claim 2, wherein etching the spacer layer until the spacer layer remains on the sidewall of the first and second sacrificial layers comprises further removing the spacer layer from the sidewall of the fin and from a top surface of the fin.

4. The method of claim 1, wherein etching the spacer layer until the spacer layer remains on the sidewall of the first sacrificial layer, the second sacrificial layer, and the first hardmask layer causes a combined lateral dimension of the spacer layer and the dummy gate to correspond to a second hardmask lateral dimension of the second hardmask layer.

5. The method of claim 1, wherein etching the spacer layer until the spacer layer remains on the sidewall of the first sacrificial layer, the second sacrificial layer, and the first hardmask layer comprises reducing a height of the spacer layer.

6. The method of claim 1, wherein etching the spacer layer until the spacer layer remains on the sidewall of the first sacrificial layer, the second sacrificial layer, and the first hardmask layer comprises reducing a height of the spacer layer to a boundary of the first and second hardmask layers.

7. The method of claim 1, wherein the second hardmask layer is a protective shield for the spacer layer underneath.

8. The method of claim 1, wherein the dummy gate has the spacer layer on the sidewall, has the first hardmask layer on a top, and has the fin on a bottom.

9. The method of claim 1, wherein the first sacrificial layer includes oxide.

10. The method of claim 1, wherein the second sacrificial layer includes amorphous silicon.

11. The method of claim 1, wherein the first hardmask layer includes nitride and the second hardmask layer includes oxide.

12. A method of pulling down a spacer layer for a dummy gate, the method comprising:
forming the spacer layer, the spacer layer being on a fin, the dummy gate, a first hardmask layer, and a second hardmask layer, wherein the dummy gate is disposed on top of the fin, the first hardmask layer is disposed on top of the dummy gate, and the second hardmask layer is disposed on top of the first hardmask layer, wherein the first hardmask layer is laterally recessed; and
continuously pulling down the spacer layer until the spacer layer remains on a sidewall of the dummy gate and the first hardmask layer, wherein pulling down the spacer layer stops at a boundary formed between the first hardmask layer and the second hardmask layer.

13. The method of claim 12, wherein pulling down the spacer layer until the spacer layer remains on the sidewall of the dummy gate and the first hardmask layer comprises removing the spacer layer from the second hardmask layer.

14. The method of claim 13, wherein pulling down the spacer layer until the spacer layer remains on the sidewall of the dummy gate and the first hardmask layer comprises further removing the spacer layer from sides of the fin and from a top surface of the fin.

15. The method of claim 12, wherein pulling down the spacer layer until the spacer layer remains on the sidewall of the dummy gate and the first hardmask layer causes a combined lateral dimension of the spacer layer and the dummy gate to correspond to a second hardmask lateral dimension of the second hardmask layer.

16. The method of claim 12, wherein pulling down the spacer layer until the spacer layer remains on the sidewall of the dummy gate and the first hardmask layer comprises reducing a height of the spacer layer.

17. The method of claim 12, wherein pulling down the spacer layer until the spacer layer remains on the sidewall of the dummy gate and the first hardmask layer comprises reducing a height of the spacer layer to the boundary of the first and second hardmask layers.

18. The method of claim 12, wherein the second hardmask layer is a protective shield for the spacer layer underneath;
wherein the dummy gate includes an amorphous silicon sacrificial layer stacked on an oxide sacrificial layer; and
wherein the first hardmask layer includes nitride and the second hardmask layer include oxide.

* * * * *